United States Patent
Fjelstad et al.

(10) Patent No.: US 7,732,904 B2
(45) Date of Patent: Jun. 8, 2010

(54) MULTI-SURFACE CONTACT IC PACKAGING STRUCTURES AND ASSEMBLIES

(75) Inventors: Joseph C. Fjelstad, Maple Valley, WA (US); Para K. Segaram, Brookfield (AU); Thomas J. Obenhuber, San Francisco, CA (US); Inessa Obenhuber, legal representative, San Francisco, CA (US); Kevin P. Grundy, Fremont, CA (US); William F. Wiedemann, Campbell, CA (US)

(73) Assignee: Interconnect Portfolio LLC, Cupertino, CA (US)

( * ) Notice: Subject to any disclaimer, the term of this patent is extended or adjusted under 35 U.S.C. 154(b) by 0 days.

(21) Appl. No.: 10/964,578

(22) Filed: Oct. 12, 2004

(65) Prior Publication Data

US 2005/0093152 A1    May 5, 2005

Related U.S. Application Data

(60) Provisional application No. 60/510,331, filed on Oct. 10, 2003.

(51) Int. Cl.
*H01L 23/02*   (2006.01)

(52) U.S. Cl. ............... 257/686; 257/758; 257/777; 257/E23.141

(58) Field of Classification Search ............ 257/685, 257/686, 723, 777, 784, 787, 773, 700, 678, 257/758, 698, 701, 725, E23.02, E23.151, 257/E23.178, E23.141
See application file for complete search history.

(56) References Cited

U.S. PATENT DOCUMENTS

| | | |
|---|---|---|
| 4,691,972 A | 9/1987 | Gordon |
| 5,373,109 A | 12/1994 | Argyrakis et al. |
| 5,475,264 A | 12/1995 | Sudo et al. |
| 5,530,287 A | 6/1996 | Currie et al. |
| 5,543,586 A | 8/1996 | Crane, Jr. et al. |
| 5,623,160 A | 4/1997 | Liberkowski |
| 5,701,233 A * | 12/1997 | Carson et al. ............... 361/735 |
| 5,821,457 A * | 10/1998 | Mosley et al. ............... 361/734 |
| 5,906,948 A | 5/1999 | Liu et al. |
| 5,969,421 A | 10/1999 | Smooha |
| 6,001,671 A | 12/1999 | Fjelstad |
| 6,020,559 A | 2/2000 | Maeda |
| 6,054,652 A | 4/2000 | Moriizumi et al. |
| 6,055,722 A | 5/2000 | Tighe et al. |
| 6,284,984 B1 | 9/2001 | Ohyama |
| 6,369,454 B1 | 4/2002 | Chung |
| 6,421,254 B2 | 7/2002 | Crane, Jr. et al. |
| 6,440,770 B1 | 8/2002 | Banerjee et al. |
| 6,441,498 B1 | 8/2002 | Song |

(Continued)

FOREIGN PATENT DOCUMENTS

JP    09-246684 A    9/1997

*Primary Examiner*—Davienne Monbleau
*Assistant Examiner*—Dilinh P Nguyen
(74) *Attorney, Agent, or Firm*—Ronald R. Shea, Esq.

(57) ABSTRACT

A cost effective, high performance, IC package assembly of the present invention comprises stair-stepped layers of redistribution circuits from at least one chip to terminals on any of multiple surfaces and levels of the IC package assembly. Critical path circuits of the assembly have no plated vias and are directly routed from interconnection terminals which are used to interconnect the package to the IC chip terminals by flip chip or wire bond methods.

29 Claims, 10 Drawing Sheets

U.S. PATENT DOCUMENTS

| | | |
|---|---|---|
| 6,538,310 B2 | 3/2003 | Hoshino et al. |
| 6,555,919 B1 * | 4/2003 | Tsai et al. .................. 257/777 |
| 6,635,957 B2 | 10/2003 | Kwan et al. |
| 6,680,530 B1 | 1/2004 | Pillai et al. |
| 6,777,795 B2 * | 8/2004 | Sasakura et al. ............ 257/686 |
| 6,900,390 B2 | 5/2005 | Halter |
| 6,900,528 B2 | 5/2005 | Mess et al. |
| 2002/0070446 A1 | 6/2002 | Horiuchi et al. |
| 2003/0218191 A1 * | 11/2003 | Nordal et al. ............... 257/200 |

* cited by examiner

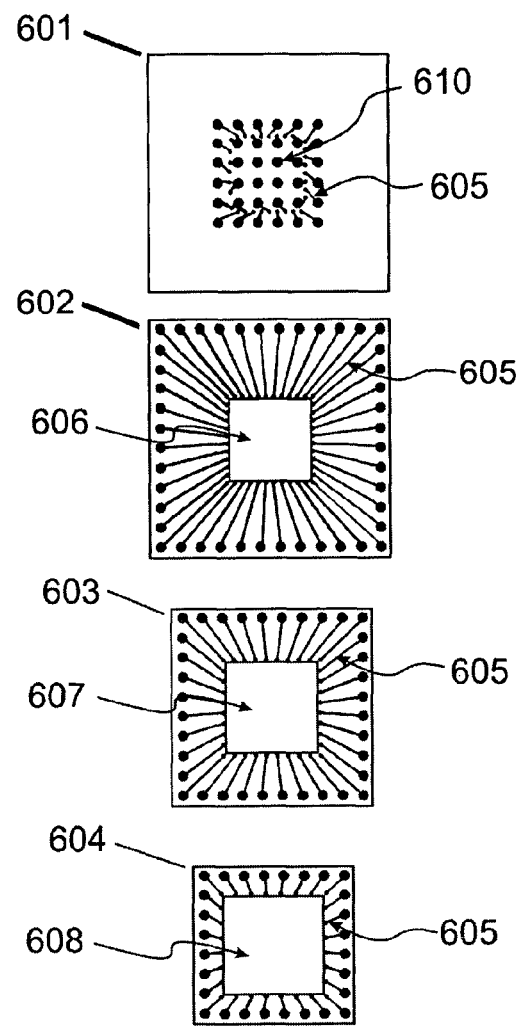
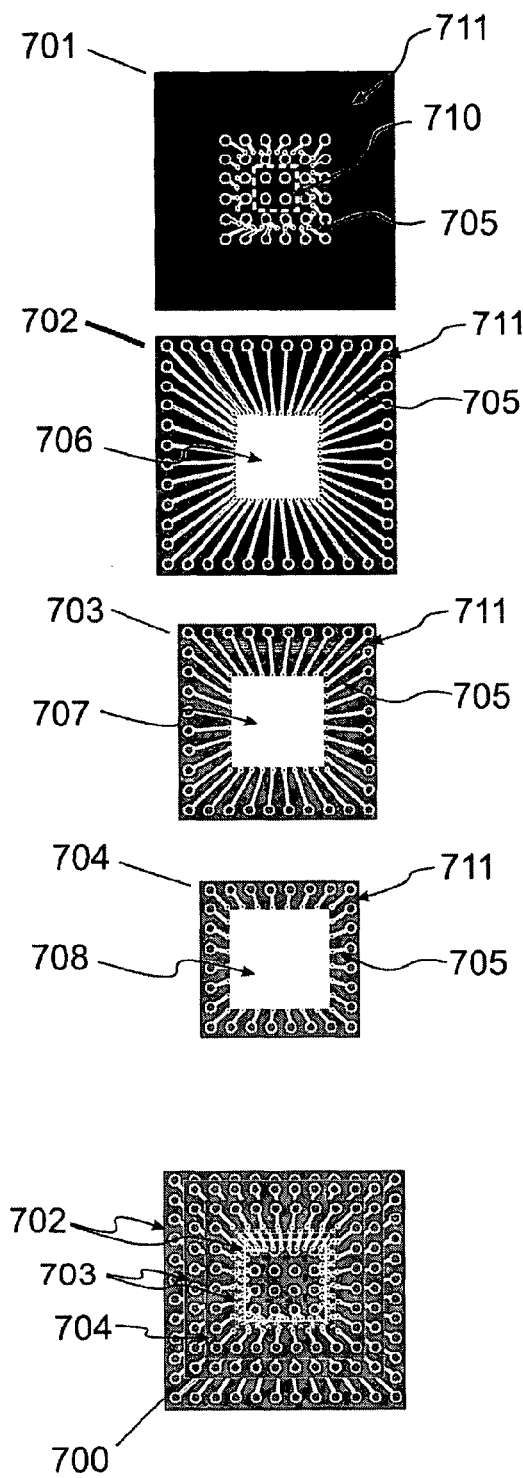
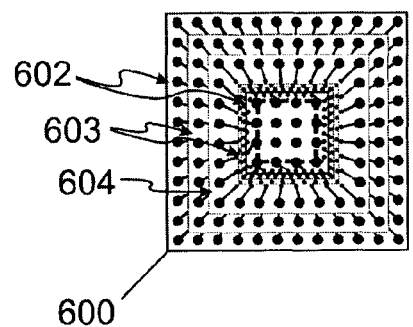
Figure 6
Figure 7

MULTI-SURFACE CONTACT IC PACKAGING STRUCTURES AND ASSEMBLIES

CROSS-REFERENCE TO RELATED APPLICATIONS

This application claims priority from, and hereby incorporates by reference, U.S. Provisional Application No. 60/510,331, filed Oct. 10, 2003 and entitled "IC Packaging Structures Providing Multi-Surface, Direct Path Interconnections with Improved Thermal Dissipation Characteristics and Methods for their Manufacture."

FIELD OF THE INVENTION

The present invention relates to the field of electronic interconnection structures and IC packaging technology.

BACKGOUND

Current integrated circuit (IC) chip packaging technologies commonly rely on either a lead frame, a tape automated bonding (TAB) substrate, a circuitized interconnection substrate, an interposer or a chip sized interconnection substrate to serve as an interconnection base for redistributing the I/O (input/output terminals) of the IC to a more practical and useful contact spacing or pitch for making interconnection between I/O terminals at the next level of assembly. An example of next level assembly is when the IC package is mounted on and interconnected to a printed circuit board. The interconnection between the IC chip or die and the chosen package is normally accomplished using either wire bonding, which connects the chip terminals to terminals on the package by microscopic wires or, alternatively, by some variation of flip chip technology, where the terminals are interconnected to the IC package substrates by means of metal bumps, solder balls, conductive adhesives or combinations of these methods.

The I/O terminals exiting the finished IC package are variously located depending on the IC package design. For lead frame type IC packages, the I/O contacts exit the edges of the structure on either two or four sides, while in the case of area array packages, the I/O contact terminals are most commonly located all on one side or surface of the completed package. Still with some package designs the contacts or leads are sometimes disposed in a manner that allows the shoulder of leaded devices to accept a like device or with through access from the bottom to the top surfaces for area array type packages to facilitate stacking of packages. One special case where this is becoming increasingly attractive is for stacking memory ICs to increase memory density. In such area array IC package constructions, the terminals may be provided with a common land or terminal that can be accessed from both top and bottom.

In all cases and with all types of IC packages, there is an associated cost for the design and construction of the lead frame, the circuitized interconnection substrate, the interposer or miniature interconnection substrate that provides the I/O pitch translation. In addition as the complexity of the structure increases so also does the cost. Moreover, there is often associated with the construction of these devices a testing step to verify their suitability for use because, for example, voids in the plating of small vias can render the substrate and thus the final product useless.

Because each IC chip design is unique in size, shape and I/O locations, the interconnection substrate used in manufacture of the final package is often also unique to the chip and requires the creation of a package design with each interconnection requiring its own circuit path on the substrate. This is especially true for higher I/O count ICs. There are exceptions, however, the most common exception to this general statement being lead frames for IC packages, which, while varied, tend to have a good measure of standardization, especially for lead frame IC packages designed to be used for wire bonding because the structure and method is more tolerant to chip size variation. Thus, the time, the materials and the processes used to create IC packages, while providing benefit, also add to cost and delay, in terms of manufacturing lead time, which, in turn, can limit opportunity associated with getting a product to market in a timely manner. Of course, in the best case, any interconnection would be made directly to the IC termination land and this can be and often is the case for chips having few I/O terminations. For example, U.S. Pat. Nos. 6,001,671 and 6,635,957 show how wire bond interconnections can made directly to the I/O terminations of the IC package. However, as I/O counts rise, this becomes a problem due to the spatial interferences and the increased risk of shorting of wires as the more distant terminations are made and if made successfully, the risk of wire sweep. As a result, a redistribution lead-frame or circuit substrate of some type is commonly used to redistribute the I/O and the terminations to the chip are made locally by short wire bonds or flip chip interconnections. In addition, because of the limits of current manufacturing practices, the same interconnection materials and process steps, which add cost to the overall finished package structure, also frequently and typically, both limit the package's electrical performance and abridge any potential versatility.

As the electronics industry of today in increasingly finding that the design and manufacture integrated circuit (IC) packaging substrates is being challenged to ever greater degrees by the increased performance demands of advanced highly integrated IC designs, there is need to reconsider design and manufacturing methods used in their construction. The current challenge is, in large part, due to the various design protocols that are commonly employed but it is also due to the mechanical, electrical and chemical nature of the materials used in their construction and the types of manufacturing and assembly processes used in traditional electronic package manufacture.

The types of materials used for making IC packages vary widely from thin flexible laminates used in the creation of chip size packages and TAB packages to thicker and very stiff refractory materials such as ceramic which is a common choice for high power or high reliability IC packaging such as is used in military and aerospace applications, however a very common material choice for fabricating many higher I/O count IC packages today is most generally a thermally cured resin, such as epoxy, reinforced by the use of a glass fiber cloth or other suitable reinforcement material. Such materials, in spite of their relatively good cost and performance benefits, present small but potentially significant challenges to the designer because of the inherent variability of the materials used and thus the resulting construction's performance will likewise vary. In fact all materials used in packaging construction can present such challenges depending on the nature of their design, construction and process variability.

The use of standard manufacturing approaches results in the potential for numerous different types of material and manufacturing related defects. These defects can include: reductions or increases in trace width, small localized reduction in trace width, reductions in spacing between traces, inconsistencies in dielectric constant due to localized changes in the material composition (e.g. alternating glass and resin rich areas) and the like. In addition to the material and process related concerns, there are also a number of design related concerns. Common design features used to create, direct, redirect or alter interconnection paths within an interconnection structure (e.g. an electronic module, printed circuit board or backplane) can, in the process of solving a routing problem, create problems in terms of signal integrity. Thus small defects and small design enabling circuit features, while not necessarily a concern at lower signal speeds, become significant impediments to clean signal transmission which is a requirement at higher speeds. Thus, these common design approaches to building both IC packages and the interconnecting structures that support them typically yield product having miniscule circuit elements features, which are a product of either to design or manufacture, that can either impede the signal or make it subject to unwanted electrical parasitic effects such as crosstalk, stray capacitance, inductance, or deviation from the constant impedance values needed for optimum circuit performance. An example, the common plated through via, which, while vital to circuit design, can significantly affect circuit performance by adding capacitance and small reflections in the signal.

Moreover, standard processing methods, because of the increasing design complexity and the challenge of producing ever smaller design features that demand greater accuracy, are also likely to be subject to reduced manufactured yield with more electrical shorts and opens resulting from finer features required to escape I/O from the IC through the IC package to the interconnection structure through metal circuits and the many vias and pads in area array structures.

A thoughtful analysis of present generation approaches to the design and manufacture of printed circuit based IC packaging technologies based on the knowledge of the significant challenges facing the entire manufacturing supply chain and considering performance limits due to the electrical parasitics associated with the changes in circuit materials, transitions through and around electrical features, such as vias the like, which in turn limit the design versatility, suggests that current approaches to design and manufacture of high performance and advanced IC packages do not appear capable of meeting the cost and performance needs of future generation IC chips even if they can achieve reasonably short design and manufacturing cycles. Thus, there is opportunity and need for cost effective performance enhancing improvements in IC package design and construction which will address the significant gap between present design and manufacturing practice options and future need and requirements of electronic packages and products.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 provides a full plane view of potential interconnection layers of the embodiment of the invention illustrated in FIG. 5.

FIG. 7 provides a full plane view of potential interconnection layers of an alternative embodiment of the invention with full metal layer capable of providing power, ground or shielding as well as redistribution circuit paths.

DETAILED DESCRIPTION

Figure 1:
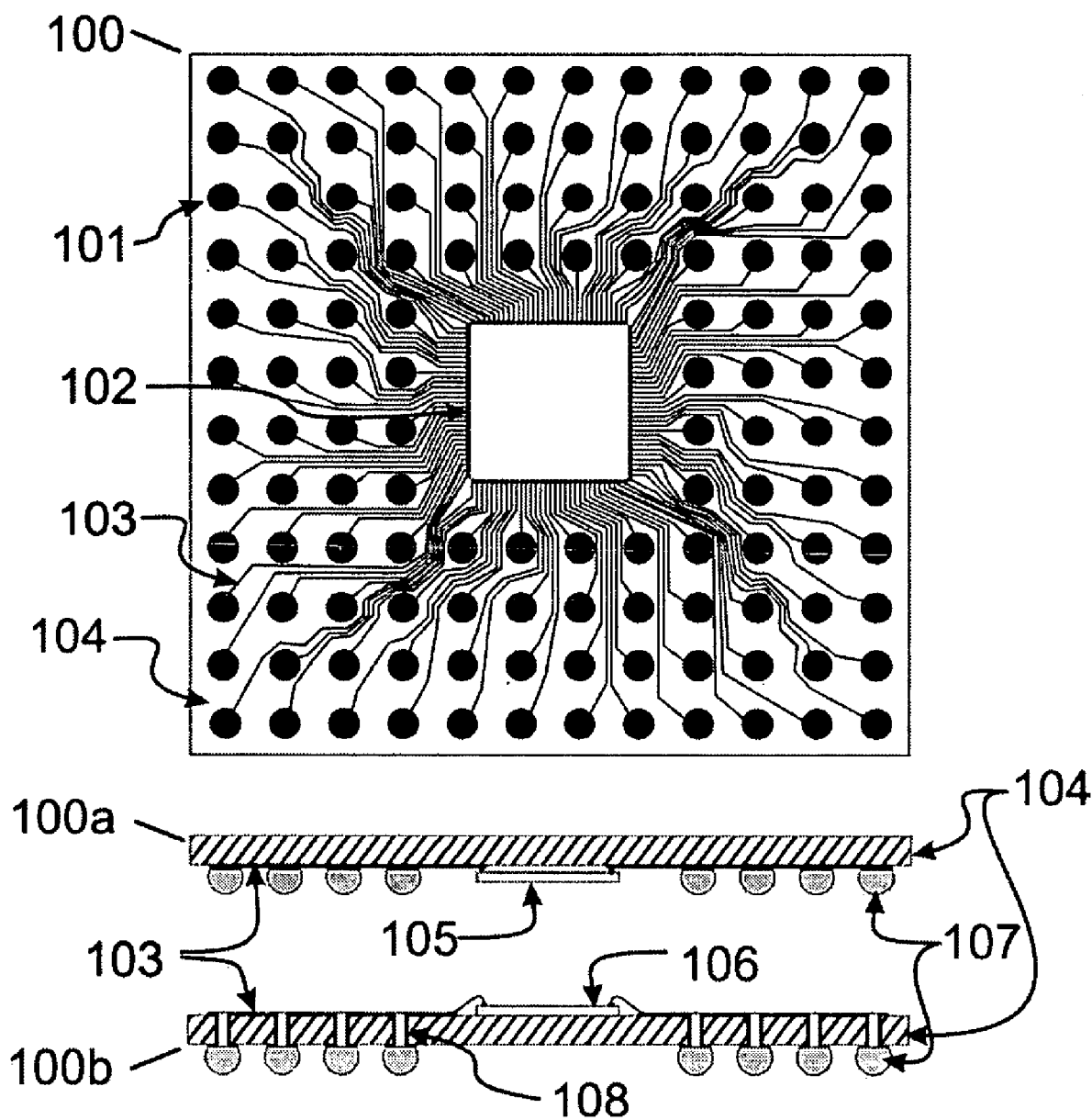
FIG. 1 illustrates fundamental prior art structures used in creating area array type (aka, BGA) IC packages.

Disclosed herewith are structures and methods for making direct path, three dimensional interconnections from surface of the chip to locations distal from the IC chip. The distal locations are potentially accessible from all sides and surfaces faces of the package. By way of example for purposes of clarification, in the case of a hexahedron (i.e., a rectangular box or cube) this would total six (6) possible while in the case of a tetrahedron the total would be four (4). Extending the concept to other still other shapes, a package in the shape of half a cylinder would have four surfaces, while a full cylinder would have only three surfaces and for a hemisphere the total would be two (2) and finally, a sphere would have only one (1) continuous surface but still with distal contacts possibly radiating from a central IC chip or IC chips. All such structures allow for interconnections to other electronic elements to be made from any appropriate surface (i.e. from the bottom, top and all sides present). Thus such structures are fully three dimensional in their interconnection potential but this is not the current practice.

There are significant performance demands that can be cost effectively met by creating and using interconnection structures of these types in electronic systems as they provide short and direct paths from the IC to terminations on the IC package. For example, the avoidance or elimination of vias for high speed signals and terminations which enter directly either into a substrate or another similarly constructed IC package from the terminations of the IC package offers compelling performance benefits. There are a potentially large number of embodiments of the IC packages invention disclosed herewith and the invention is better understood with the aid of drawings.

In the following description and in the accompanying drawings, specific terminology and drawing symbols are set forth to provide a thorough understanding of the present invention. In some instances, the terminology and symbols may imply specific details that are not required to practice the invention. For example, the interconnection between chip terminations and next level I/O terminations may be shown or described as single conductor signal lines but they may also be coaxial, microstrip or stripline connections. While it is common to make only one connection from a chip to a terminal on a package, it is herein possible to make multiple connections from a single IC chip terminal to multiple conductors on multiple levels of distal I/O terminals. In addition, multiple terminals on a single chip or terminals from different chips, in the case of a multi-chip package, could be made to common terminals on the package. Signal lines created in the packages described may alternatively be single-conductor signal lines and each of the single-conductor signal lines may alternatively be multi-conductor signal lines. Signals and signaling paths shown or described as being elements of the IC package design and manufacture process a being single-ended may also be differential, and vice-versa to meet the specific needs of an individual circuit design. The shapes of termination pads may be shown to be round but may be any shape to facilitate differing interconnection technologies (eg solder, adhesive, etc. . . . ).

In embodiments of the present invention, high-speed, low complexity structures are disclosed that facilitate substantially direct connection between I/O terminals on a chip with I/O terminals of the IC package which contains it without passing through a plated through hole via. A first aspect of the invention is to create IC package structures that provide shortest path interconnections with high levels of signal integrity through novel structures and methods. A second aspect of the present invention is to allow for direct path I/O terminations to be made from the chip to any or all chosen surfaces and levels of the IC package structure. A third aspect of the invention is to create IC package structures that allow for improved access to differential signals. A fourth aspect of the invention is to create IC package structures that facilitate the construction of shielded connections within an IC package structure to minimize or eliminate crosstalk. A fifth aspect of the invention is to create IC package structures that can be integrated in novel ways by allowing devices to be overlapped. A sixth aspect of the invention is to facilitate the integration of ESD control elements into the package to allow the IC to be reduced in size by allowing removal of ESD control circuitry from the IC. A seventh aspect of the invention is to provide means for integrating discrete devices into the IC package structure. An eight aspect of the invention is an IC package structure that creates, in situ, substantially coaxial interconnections in the structure and simultaneously having improved thermal transfer characteristics. A ninth aspect of the invention is to provide an IC package structure that is capable of supporting the transmission paths for both electronic and optical signals.

These and other aspects of the invention are described below and/or illustrated in the drawings and the description of the accompanying figures will make cleared the cited objectives.

FIG. 1 illustrates fundamental prior art structures for use in creating an area array IC package (100). The two major variations of this package type are flip chip (100a) and wire bond (100b). In such structures, the routing of signals (103) on a suitable base material (104) is performed in a manner that has each signal trace routed on a single surface from the bond pad connection point (102) to a target terminal (101). Only a single metal layer is shown but multiple layers are common. Shown also is how plated through holes (108) may be used to make connection from one side of the package to the other to facilitate connection between the distal IC chip on package and the next level substrate and how the chip is interconnected by either wire bonding (106) or flip chip (105) techniques.

Figure 2:
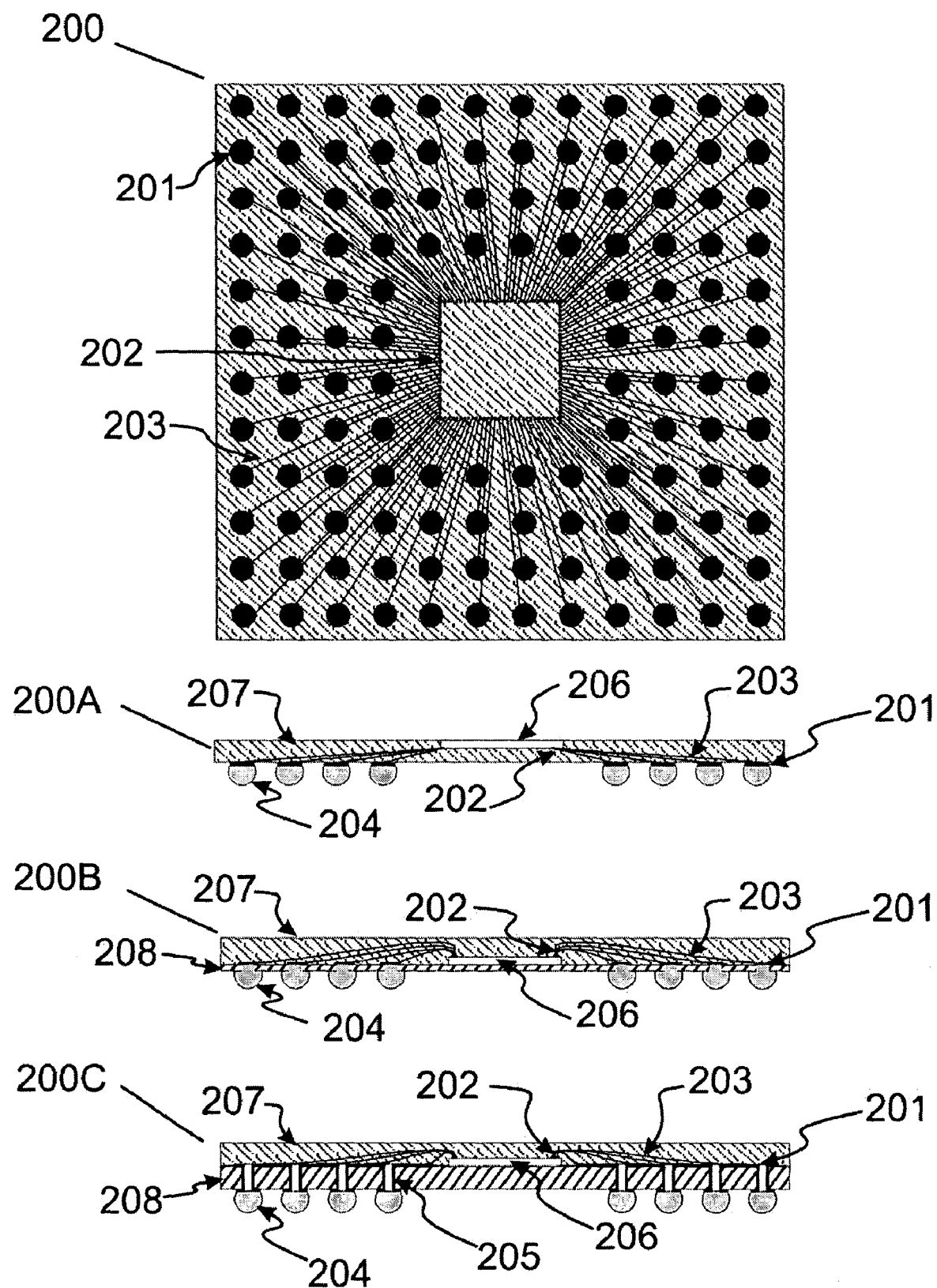
FIG. 2 illustrates package embodiments of using direct wire interconnections between the chip and the I/O terminations which serve for interconnection to next level substrates.

FIG. 2 illustrates embodiments of the invention using direct wire interconnections between the chip and the I/O terminations. The package shown full surface (200) has direct wire path interconnections (203) from the I/O terminals of the IC chip (202) to the I/O terminals that serve to make interconnection to the next level circuit substrates (201). There are several possible embodiments of this basic structure and representative examples are shown in cross section (200A, 200B, and 200C). Turning first to structure 200A, the IC (206) is interconnected directly its terminals (202) with wires (203) to distal terminals (201) which can have solder balls (204) to make solder connection to the next level substrate. The entire assembly is molded with an encapsulant (207). Turning now to structure 200B, the IC chip is mounted on an insulating substrate (208) having terminations (201) which are accessed directly by solder balls (204) through holes in the insulating substrate material. The bond wires (203) are directly connected from the chip (206) to the terminals (201) and the assembly is over molded with an encapsulant (207). Turning finally to structure 200C, the IC chip again is mounted on an insulating substrate (208) having distal terminations (201) which are electrically accessed through the insulating substrate by plated through holes (205) and connected to solder balls (204). The bond wires (203) are directly connected from the chip (206) to the terminals (201) and the assembly is over molded with an encapsulant (207)

Figure 3:
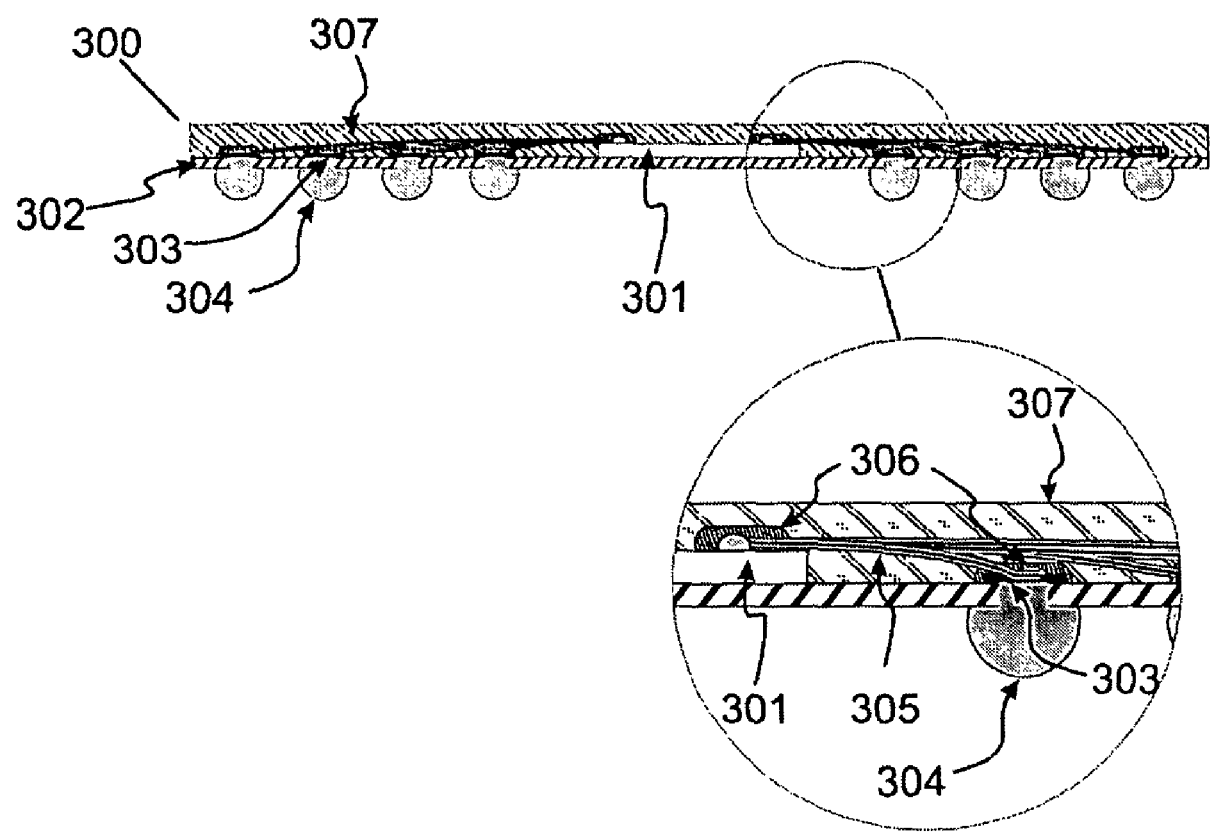
FIG. 3 illustrates an embodiment of the invention wherein the direct path wires from the chip and their terminations are insulated after interconnection and then coated with metal and encapsulated or encapsulated with a conductive polymer to create coax-like interconnections between the chip and the distal I/O terminals.

FIG. 3 illustrates an embodiment of the invention for high electrical and thermal performance. In the figure, the overall package structure (300) is shown in cross section and showing an insulating substrate (302) having mounted thereon an IC chip (301) which is interconnected from terminals on the chip to distal terminations (303) that are accessed by holes that can accept solder balls (304) and the entire assembly overmolded with a conductive encapsulant that serves both the electrical and thermal needs of the package. Turning to the enlarged view of the area of the over all package structure (300) circled, more detail of the structure is revealed. The wires can be converted to coaxial-like connections, in situ, by, for example, protecting the terminations on the chip (301) and at the distal end of the wire (303) with an insulating encapsulant (306). The wires may be initially insulated prior to bonding or alternatively coated with a uniform coating of insulator (305), such as parylene. The overall structure can then be encapsulated with a conductive material. The resulting IC package structure has the insulated wires uniformly surrounded by conductive material that mimics the structure of true coaxial interconnections. In addition, because of the high metal content, the thermal conductivity is higher. If a suitable coaxial wire can be used, the metallic content of the encapsulant may not be needed but the thermal conductivity will be less.

Figure 4:
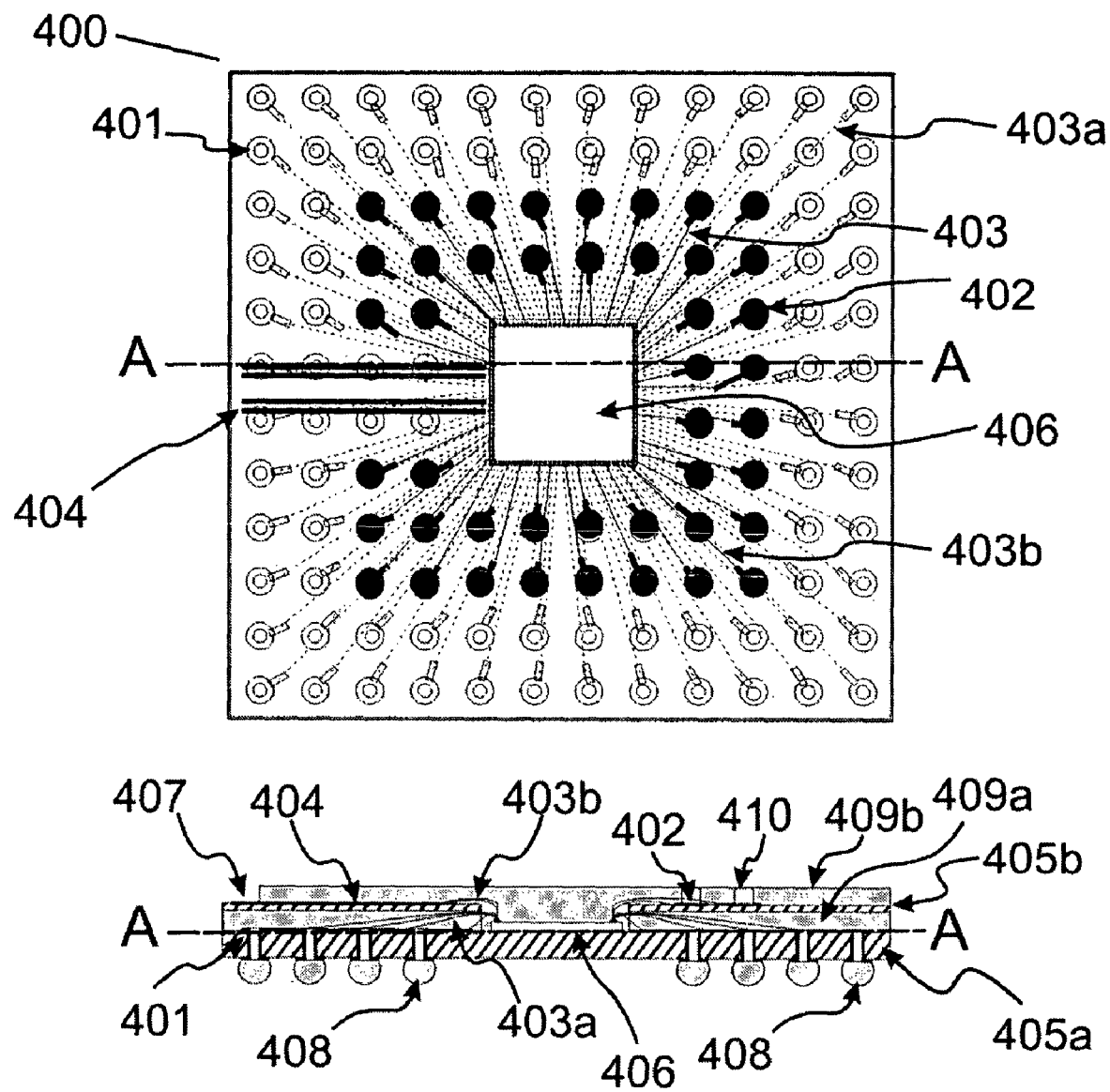
FIG. 4 illustrates top and side views of an embodiment of the invention that employs circuit laminates that define I/O terminations on separate layers to allow access to the chip terminations from upper and lower surfaces, the lower surface being accessed by plated through holes or by direct access at the edge to create a skew free differential pair.

FIG. 4 illustrates an embodiment of the invention that uses direct interconnection on more than one layer of insulating substrate. In the figure, an over view of one major surface of the package (400), the interconnections to a far surface array of terminals with plated through holes (401) are shown in phantom or dotted line format as are the wires (403*a*) that interconnect them to the IC chip (406) in the center of the structure. The interconnections to the near surface array terminals (402) are shown in solid line format as are the wires (403*b*) that interconnect them to the IC chip (406) in the center of the structure. Selected terminals can be designed to be routed and interconnected in a manner that allows them to be brought directly to the edge of the package as, for example, differential pairs (404) as shown. Such pathways can provide controlled impedance with near zero signal skew. Section A-A is provided in the lower part of FIG. 4 to clarify the construction. A lower level interconnection substrate (405*a*) having interconnection terminals with plated through holes (401) that are interconnected to the chip (406) by wires (403*a*) and the subassembly is encapsulated with a first encapsulant (409*a*). The IC package of this structure has another interconnecting substrate (405*b*) with terminals (402) with apertures (410) through a second layer of encapsulant (409*b*) interconnected by wires (403*b*) to the chip (406). Direct path circuits routed to or proximate to the edge of the package (404) are exposed near the edge (407) to facilitate their being connected to another device, for example, a controlled impedance cable (not shown). When completed, the IC package can be provided with solder balls (408) to make connection to next level circuits.

Figure 5:
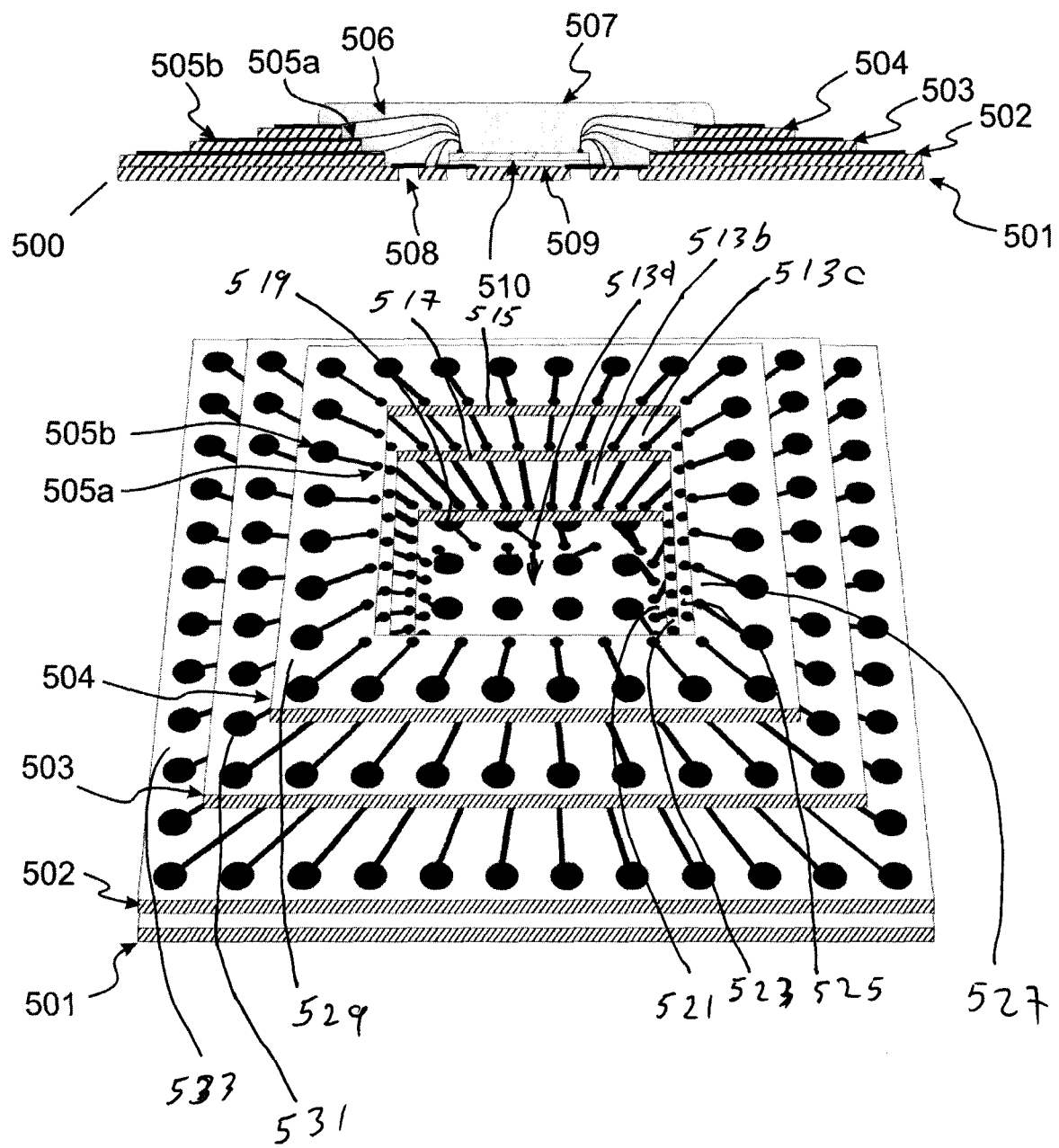
FIG. 5 illustrates another embodiment of the invention in perspective and side views of elements of a tiered IC package structure which allows direct path interconnections on several circuit surfaces including all sides, including first surface level, middle exposed surface levels and side opposite surface level.

FIG. 5 provides an illustration of another embodiment of the invention. In the example is shown an example of a package in cross section (500), comprised of a number of layers (501-504) with distribution circuitry (505*a*, 505*b*). Certain of the layers in the illustration, specifically 502 to 504, have decreasing external dimensions and correspondingly larger central apertures, moving upward in the stack from 502 to 504. The lower circuit layer (501) has an IC chip (510) bonded to its surface using an insulating bonding adhesive material (509) because it is shown resting on electronic terminals and shorting would result, however, when there are no electronic terminals disposed beneath the IC, a conductive adhesive could be used. All metal circuit layers of the package are interconnected either to the chip and/or in some cases, if required by the design, to each other by wires (506). In the example, openings (508) are provided in the insulating material of circuit layer (501) to provide access to the I/O terminals beneath or near the chip. The assembly is encapsulated using a suitable molding or insulating material (507). Bonding wires may be constructed coaxially as previously described.

Turning to the lower portion of the illustration is a perspective view, of the layers (501-504) shown stacked in order but unassembled with a small gap between the circuit layers. The figure illustrates that each of the layers has on their major surfaces, redistribution circuitry, which have interconnection terminals (505*a*) for making connection with the chip 509, and, at the distal ends of the circuit traces, outer terminal connections (505*b*) for use with next level circuit connections. According to an embodiment, conductive contacts 505*a*, 505*b* are disposed on the insulating base 501. The lower portion of FIG. 5 also clearly illustrates how the stacked layers of the assembly have diminishing external dimensions when moving up in the stack. Through this configuration, each layer exposes the outer terminal connections 505(*b*) formed along the outer peripheral surface regions 529, 531, 533 of the next layer down in the stack. As the external dimensions decrease on successive layers, there is a corresponding increase in the size of their respective apertures 513*a*, 513*b*, 513*c*, which are delimited by interior edges 515, 517, 519 of the respective layers. The increasing size of the successive apertures exposes respective inner peripheral surface regions 521, 523, 525, 527 on which terminals of the conductive paths are exposed. The inner peripheral surface regions are immediately adjacent a corresponding aperture of a particular layer, except for layer 501, which is depicted without an aperture. The decreasing external dimension and increasing aperture size of successive layers thereby ensures that the terminations at both ends are freely accessible. While the illustration shows only a single row of contacts on each layer, more than one row is possible for each layer. In addition, each circuit layer can be fabricated with two metal layers having circuits on one side and, for example, a ground on the second side. In such cases, an insulating layer would be required between metal circuits to prevent shorting.

FIG. 6 provides views of the discrete circuit layers (601-604) of an embodiment of the invention in full plane views of and a plane view of the assembly when all of the layers are stacked in order atop one another (600). In the illustration, the base layer (601) has an array circuits having of terminations at either end (605), one end for connection to the IC chip and the second end for termination to a next level circuit element or substrate. The central area of the array can be provided with one or more not electrically connected dummy terminals (610) that provide floating ground, a thermal path or provide stabilizing contacts on the far side of the layer when assembled. Continuing with layer 602, it is shown as being the same size as the base but could be larger or smaller depending on the design need. The layer has circuits (605) with terminals at either end. The end nearest the outer edge is for connection to the next level circuit or device and the end nearest the center is for connection to the chip. The opening (606) is sufficiently large to provide access to the wire bond pads of layer 601 when assembled. Again continuing, now with layer 603, it is shown as being smaller in external dimensions than layer 602. Layer 603 has circuits (605) with terminals at either end. The end nearest the outer edge is for connection to the next level circuit or device and the end nearest the center is for connection to the chip. The purpose is, again, to expose the next level interconnections (605) terminals of layer 602. The opening in the layer (607) is sufficiently large to provide access to the wire bond pads of layer 602 when assembled. Once again and continuing now with layer 604, it is shown as being smaller in external dimensions than layer 603. Layer 604 also has circuits (605) with terminals at either end. The end nearest the outer edge is for connection to the next level circuit or device and the end nearest the center is for connection to the chip. The purpose is, again, to expose the next level interconnections (605) terminals of layer 603. The opening in the layer (608) is sufficiently large to provide access to the wire bond pads of layer 603 when assembled.

This process can continue until the number of layers required is achieved. The stacked assembly (600) is illustrated at the bottom of the figure illustrating that successive layers of interconnections (601-604) do not interfere with the free access to terminals on any layer for assembly of chip or package. Layer 601 is not labeled in this portion of the figure but its surface can be clearly seen in the center of the assembly.

FIG. 7 provides views of the discrete circuit layers (701-704) of an embodiment of the invention in full plane views of and a plane view of the assembly when all of the layers are stacked in order atop one another (700). In the illustration, all layers are shown with a metal fill fully surrounding the circuits of each layer with relief around each circuit to prevent shorting. The metal layer can serve as a ground layer, a power layer or if separated into sections, a number of ground and power layers having different voltages. The structure of the metal layer also leaves it open to possible use as a combination circuit and ground reference layer for controlled impedance designs. In the figure the package base layer (701) has an array circuits having of terminations at either end (705), one end for connection to the IC chip and the second end for termination to a next level circuit element or substrate. All circuits are surrounded by metal, however, in the area where wire bonding is to take place, the metal may terminate due to space constraints. The metal layer can be shorted to circuits if desired to make them into circuit element connections. The central area of the array can be provided with one or more not electrically connected dummy terminals (710) that provide thermal relief or they can be shorted to provide a ground and thermal path or simply provide stabilizing contacts on the far side of the layer when assembled. Continuing with layer 702, it is shown as being the same size as the base but could be larger or smaller depending on the design need. The layer has circuits (705) with terminals at either end. The end nearest the outer edge is for connection to the next level circuit or device and the end nearest the center is for connection to the chip. The opening (706) is sufficiently large to provide access to the wire bond pads of layer 701 when assembled. Again continuing, now with layer 703, it is shown as being smaller in external dimensions than layer 702. Layer 703 has circuits (705) with terminals at either end. The end nearest the outer edge is for connection to the next level circuit or device and the end nearest the center is for connection to the chip. The purpose is, again, to expose the next level interconnections (705) terminals of layer 702. The opening in the layer (707) is sufficiently large to provide access to the wire bond pads of layer 702 when assembled. Once again and continuing now with layer 704, it is shown as being smaller in external dimensions than layer 703. Layer 704 also has circuits (705) with terminals at either end. The end nearest the outer edge is for connection to the next level circuit or device and the end nearest the center is for connection to the chip. The purpose is, again, to expose the next level interconnections (705) terminals of layer 703. The opening in the layer (708) is sufficiently large to provide access to the wire bond pads of layer 703 when assembled. This process can continue until the number of layers required is achieved. The stacked assembly (700) is illustrated at the bottom of the figure illustrating that successive layers of interconnections (701-704) do not interfere with the free access to terminals on any layer for assembly of chip or package. Layer 701 is not labeled in this portion of the figure but its surface can be clearly seen in the center of the assembly.

Figure 8:
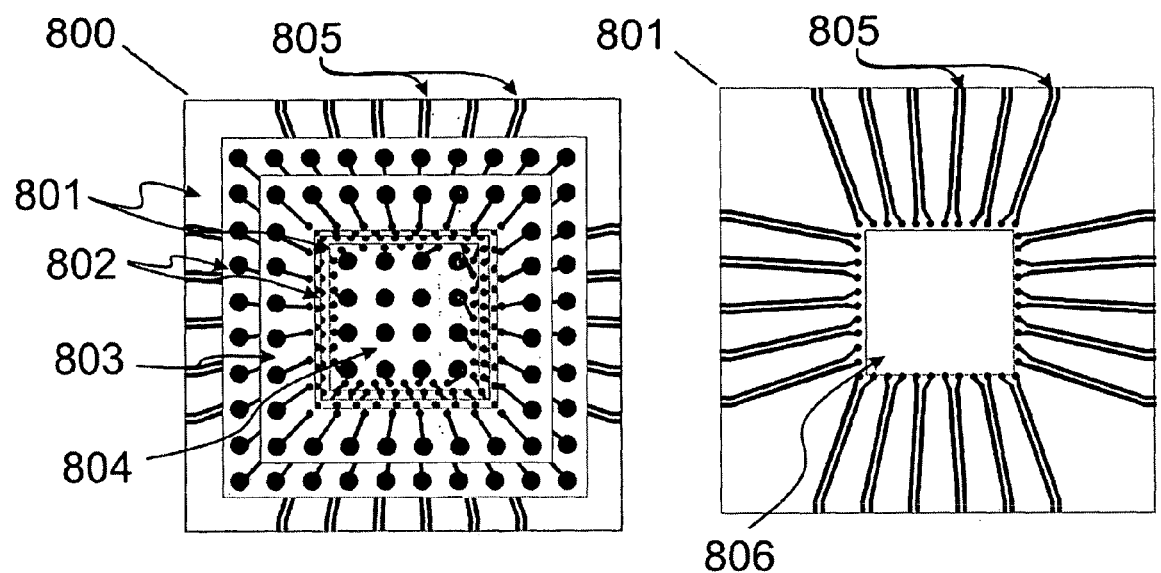
FIG. 8 illustrates views of an embodiment of the invention wherein differential pairs of controlled impedance circuits are routed to the edge of the IC package structure to facilitate better chip-to-chip interconnection and signal transmission.

FIG. 8 illustrates an embodiment of the invention wherein differential pairs of controlled impedance circuits are routed to the edge of the IC package structure to facilitate better chip-to-chip interconnection and signal transmission. The chip ready package (800) comprising layers of circuits (801-804) providing direct path terminations from the chip to I/O terminals on each layer as previously described is illustrated. Layer 801 is provided with circuit traces (805) which are routed to the edge of the package. The circuits may however be terminated short of the edge of the package. The layer 801 is illustrated with a central aperture (806) but it is not a necessity depending on the layer's locations in the stack. The circuits (805) are illustrated as fanned out differential pair circuits but the routes can be straight or circuitous depending on the particular needs of the design. The circuit layer could also be provided with coiled circuit to create an inductor if desired. More than one layer of the package can be treated in the manners described if desired.

Figure 9:
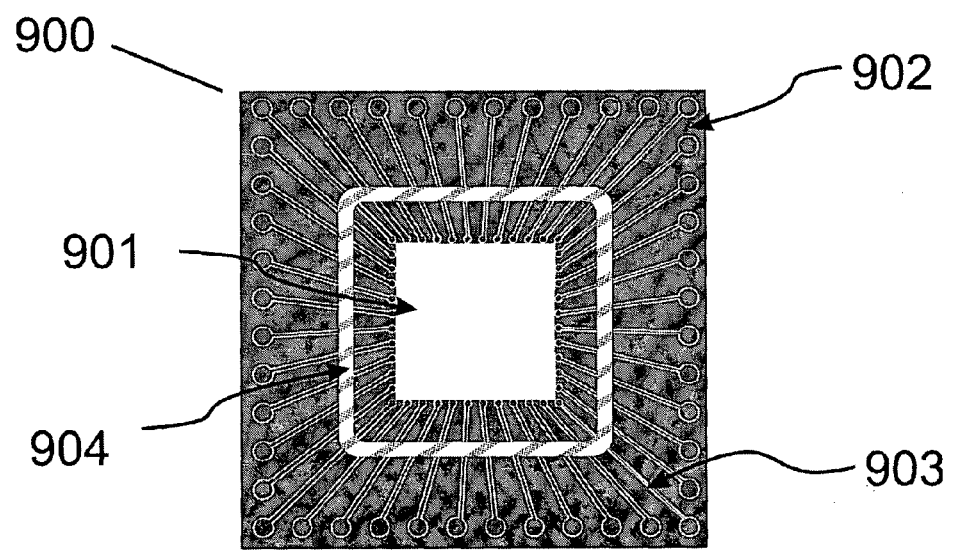
FIG. 9 illustrates an embodiment of the invention wherein an interconnection layer with integral ground is modified with an voltage switchable ESD controlling material deposited on the circuit layer which provides a path to the surrounding ground area.

FIG. 9 illustrates an embodiment of the invention wherein an interconnection layer (900) having a metal fill (903) surrounding all circuits (902) is provided with a voltage switchable ESD controlling material (904) deposited on the circuit layer which provides a path to the surrounding ground area when the fill metal is used as a ground element for the IC package assembly. In the figure, the circuit layer is illustrated with an aperture (901), however, this element is unrelated to the ESD as it can be applied to any layer and is preferably applied to all layers.

Figure 10:
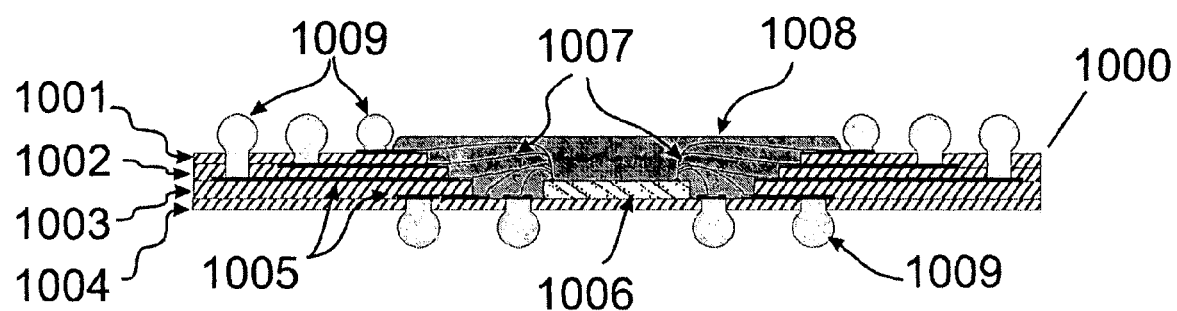
FIG. 10 illustrates another embodiment wherein the entire structure is made using standard printed circuit materials and processes to create a multilayer IC package structure and having the terminations accessed after lamination by a suitable process.

FIG. 10 illustrates another embodiment of the invention. The assemble IC package (1000) is shown in cross section. The package has four layers of insulation base material (1001-1004) each layer having circuits (1005) which connect chip wire bond connections (1007) from chip (1006) to package body with package solder terminals (1009) used for next level interconnection. The terminals on the exterior of the IC package are shown with solder balls terminal (1009) making direct connections to the internal package circuits. Each successive layer has shorter circuit paths to allow clear access to the circuit ends after lamination by a suitable process (e.g., laser skiving). The chip and wire bonds are protected by a suitable encapsulant or molding compound (1008).

Figure 11:
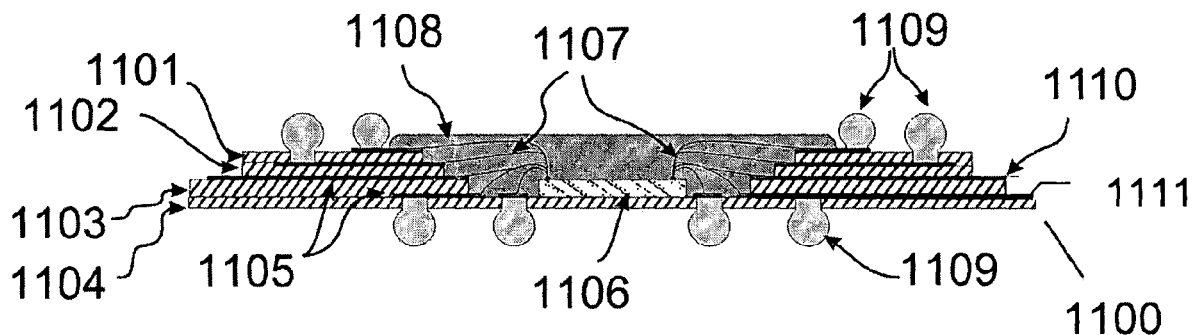
FIG. 11 illustrates another embodiment of the invention having differing terminations on various surfaces for different circuit functions.

FIG. 11 illustrates another embodiment of the invention. The assemble IC package (1100) is shown in cross section. The package has four layers of insulation base material (1101-1104) each layer having circuits (1105) which connect chip wire bond connections (1107) from chip (1106) to package body with package solder terminals (1109) used for next level interconnection. Most of the terminals on the exterior of the IC package are shown with solder balls terminal (1109) making direct connections to the internal package circuits, with successive layer has shorter circuit paths to allow clear access to the circuit ends after lamination by a suitable process (e.g., laser skiving), however in the illustration is also shown the layer 1103 having direct access at the edge (1110). While the image shows it at the edge, the circuit can also terminate near the edge. The lowest level metal circuit layer can be accessed from either side and the circuit path can be shared if desired between interconnecting circuits on top and bottom (1111) The chip and wire bonds are protected by a suitable encapsulant or molding compound (1108).

Figure 12:
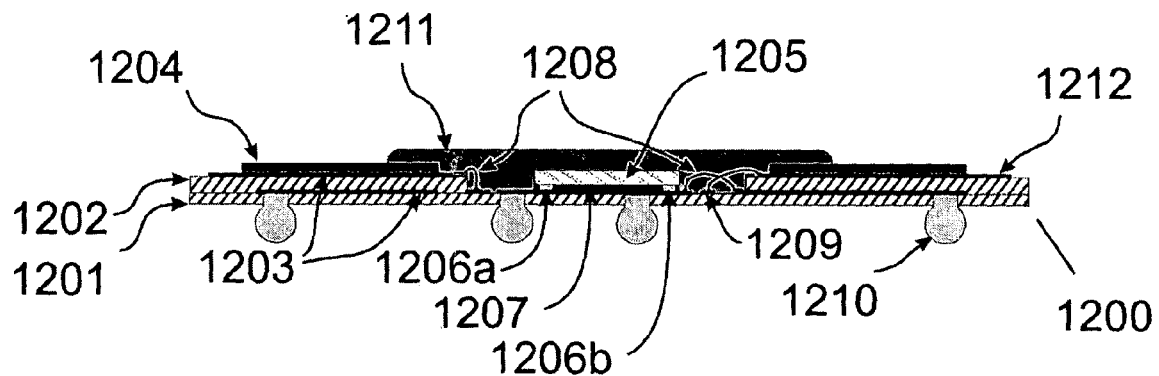
FIG. 12 illustrates an embodiment of the invention illustrating how mixed assembly technologies of flip chip and wire bond can be used to create interconnections for a chip or chips.

FIG. 12 illustrates an embodiment of the package having mixed chip flip chip and wire bond assembly technologies. The package (1200) has insulating layers (1201 and 1202) with redistribution circuits (1203) that connect to either solder terminals (1210) or directly accessible connections for other terminations such as upper surface terminations (1212) which are protected along a portion of their length by a solder mask or similar insulating material (1204). In the illustration, the package assembly has an IC interconnected by flip chip technology (1205) and provided with an underfill encapsulant material (1207) to protect the interconnections. Certain interconnections make direct interconnection to the IC flip chip connection (1206a), however others make connection to terminations in the package by bonding wires (1208) from wire bonding terminations (1209) away from the chip but interconnected to the chip by its other flip chip interconnections (1206b). The chip assembly with added wire bond connections can then be encapsulated with a suitable material (1211).

Figure 13:
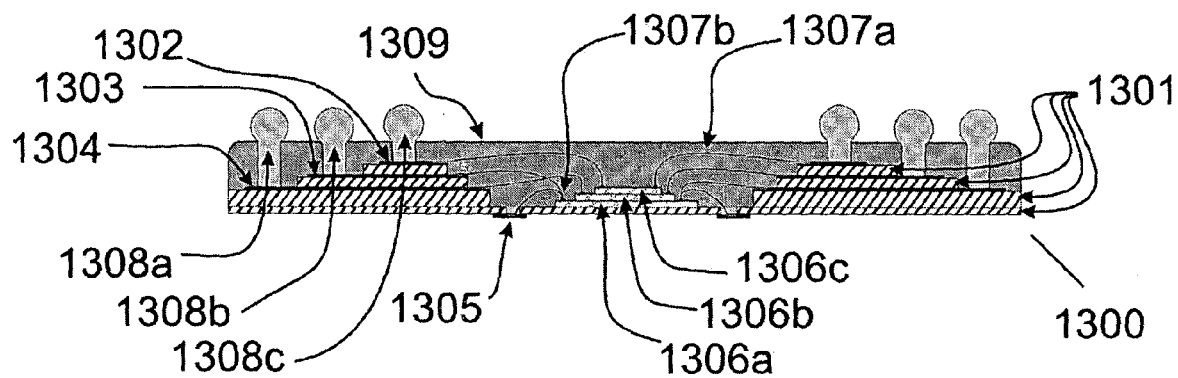
FIG. 13 illustrates an embodiment of the invention wherein chips are stacked within the IC package structure allowing for a variety of possible interconnections to be made between chips within the package and I/O terminal locations within the package.

FIG. 13 illustrates in cross section an embodiment of the invention wherein IC chips are stacked within the IC package. The IC package assembly (1300) has two or more layers of redistribution interconnection (1301) that terminate at lands (1302-1305) distal from the terminals of the various stacked IC chips (1306a-1306c). Bond wires may be used to make interconnection from one chip to only one terminal (1307a) or more than one wire bond can be made to a single terminal (1307b). In addition, the wire terminations can be made such that each chip has its own layer or chips can be connected to various layer and various other chips in the package. Terminations on the package can be made by having solder balls of different sizes to compensate for the step heights of each layer (1308a-1308c) when the package is assembled to a planar interconnection structure. The IC packaging structure allows for a variety of possible interconnections to be made between chips within the package and the various I/O terminal locations within the package.

Figure 14:
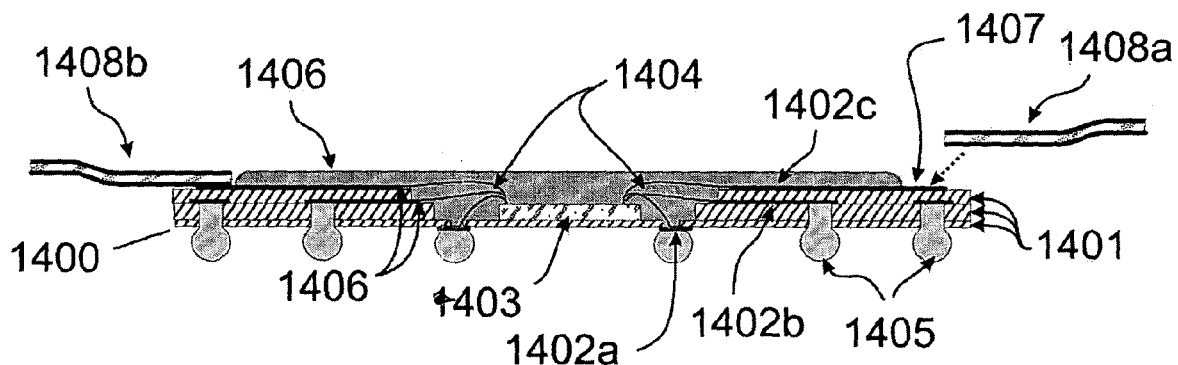
FIG. 14 illustrates an embodiment of the invention wherein at least one surface tier on at least one side of the package is connected to a cable providing direct, uninterrupted interconnection to other electronic devices, circuit boards or systems.

FIG. 14 illustrates another embodiment of the invention. In the figure the IC package assembly (1400) is illustrated in cross section. The circuit insulation layers (1401) isolate the redistribution circuits (1402a-1402c). An IC chip (1403) is attached to the substrate and bonding wires (1404) are used to interconnect the chip to package wire bond terminal locations (1406). An encapsulant or molding material (1406) is provided to protect the chip and the bonded wires. The package has solder terminals (1405) for making interconnection. Only one side is shown with solder ball terminations in the figure, however, solder terminations could be provided on both sides depending on the design. A cable (1408a), which shown being readied for attachment, can be brought to the package on one or more sides to make interconnection. A second cable (1408b) is shown as being attached to the surface of the package. The cable could be controlled impedance, such as stripline, microstrip or coaxial or it could serve simple functions such as power and ground connections depending on the needs of the design.

Figure 15:
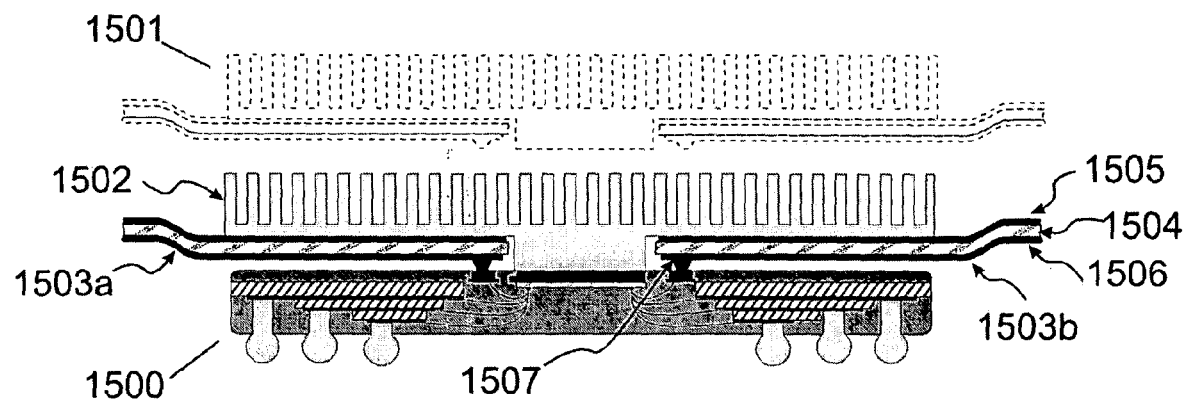
FIG. 15 illustrates an embodiment of the invention wherein a heat spreader having at least one integral cable is connected to the package and the back side of the chip.
Figure 16:
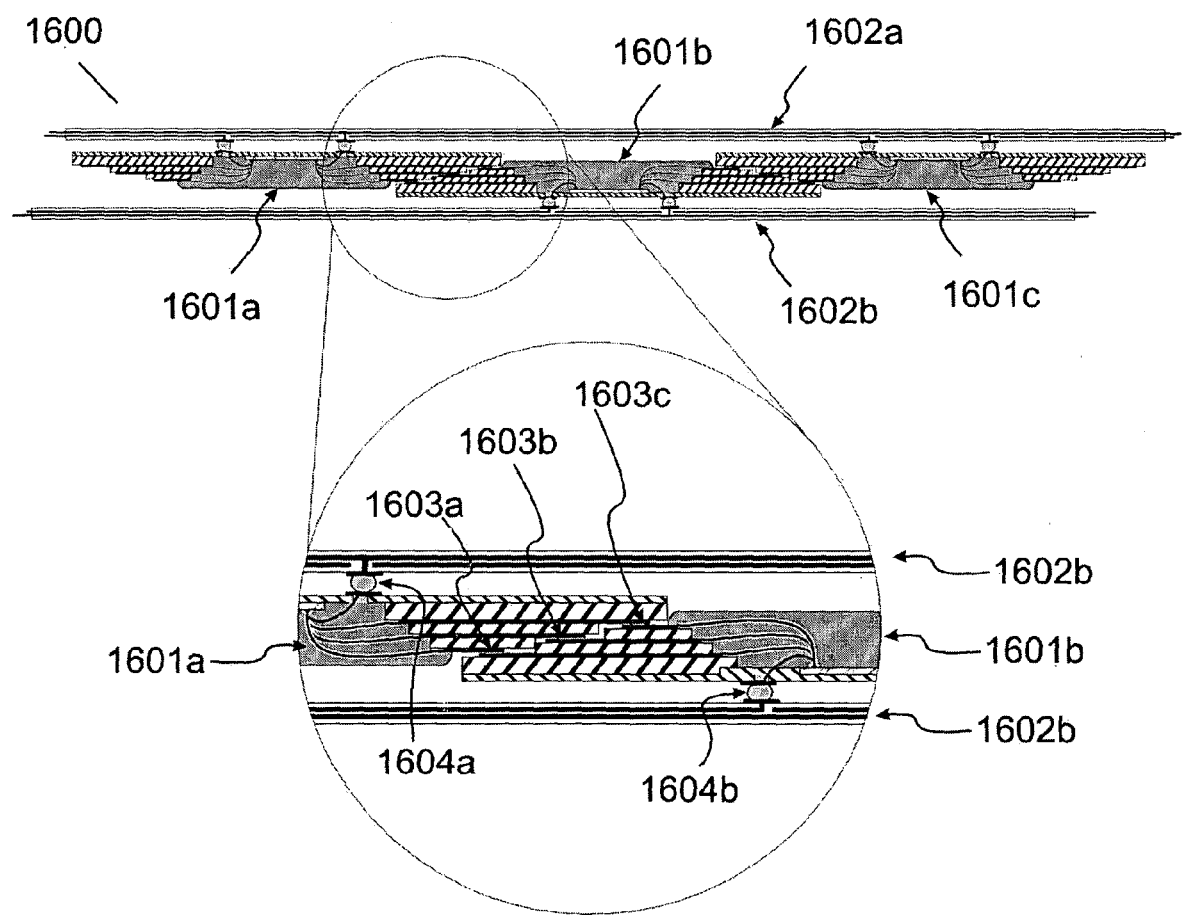
FIG. 16 illustrates an embodiment of the invention wherein multiple IC package structures are interconnected by overlapping at least one of the tiered surfaces of each package on at least one side while the second side is optionally interconnected to other circuit or system elements by other means.

FIG. 15 illustrates another embodiment of the invention. In the figure an assembled IC package having contacts on upper and lower surfaces (1500) is fitted with a heat spreader assembly with integral cables shown both separated in phantom lines (1501) and assembled to package. In the assembled structure, the heat spreader (1502) has attached to it cables (1503a and 1503b) which are connected to the package. In the illustration the cables are shown with raised contacts (1507) to facilitate contact to the upper surface of the IC package assembly. In the figure the cable is shown as having a central insulating core (1504) with an upper ground or shield layer (1505) and a signal trace (1506). Such a cable structure is representative of a microstrip controlled impedance cable structure however the cable could also be a stripline or coaxial cable or it could serve simple functions such as power and ground connections depending on the needs of the design FIG. 16 illustrates a further embodiment of the invention. In the figure is shown a partial view of an assembly (1600) having multiple IC package structures (1601a-1601c) that are interconnected by overlapping at least one of the tiered surfaces of each package on at least one side to make interconnection between the packages while the second side is optionally interconnected to other circuit or system elements by other means such as cables (1602a and 1602b). In the enlarged view of the figure representing the circled portion of the upper figure. The enlargement shows package 1601a and package 1601b overlapped and connected to one another at locations 1603a, 1603b and 1603c by a suitable means such as solder or a conductive adhesive. Cables 1602a and 1602b are shown connected to the obverse surfaces of both packages at locations 1604a and 1604b respectively.

While the invention has been described to infer in all cases use of metal conductors for transporting electrons, a number of embodiments of the invention anticipate their potential use in the transmission of photons or other electromagnetic spectra wavelengths of energy which might benefit from direct path interconnections.

Although the invention has been described with reference to specific exemplary embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. An integrated circuit (IC) package assembly for interconnecting and space transforming the I/O terminals from locations on a first IC die within the package assembly to I/O terminal locations distal from the first IC die, comprising:
 a first circuit layer having a first surface with a first plurality of conductive paths disposed thereupon, including a first conductive path extending from an interior IC package terminal disposed on a first exposed region of the first surface to an exterior IC package terminal disposed on a second exposed region of the first surface; and
 a second circuit layer having a second surface with a second plurality of conductive paths disposed thereupon, including a second conductive path extending from an interior IC terminal disposed on a first exposed region of the second surface to an exterior IC package terminal disposed on a second exposed region of the second surface, wherein a portion of the first conductive path is covered by the second circuit layer, the first exposed regions of the first and second surfaces are arranged in stair step structure, and the second exposed regions of the first and second surfaces are arranged in stair step structure.

2. The IC package assembly of claim 1 wherein the first IC die is interconnected directly to at least one of the first circuit layer and the second circuit layer.

3. The IC package assembly of claim 1 wherein there are no vias in critical circuit paths.

4. The IC package assembly of claim 1 wherein at least one of the circuit paths on the first circuit layer comprises a differential pair conductors from a point of connection to the first IC die to a location proximate to an edge of a layer of the IC package assembly on which the circuits are disposed.

5. The IC package assembly of claim 1 further comprising a second IC die.

6. The IC package assembly of claim 1 wherein IC in the package assembly is configured to receive a like package assembly with over lapping terminations making interconnection to at least one terminal point on at least one level of each of the overlapped IC package assemblies.

7. The IC package assembly of claim 1 wherein the first IC die is assembled to cable with overlapping terminations making interconnection to at least one terminal point on at least one level of the packages and the overlapped cable.

8. The IC package assembly of claim 1 wherein the first IC die has vertical terminations for I/O which interconnect to next level interconnection systems and the terminations are of different heights so that the tops of the terminations are planar.

9. The terminations of the IC package assembly of claim 8 wherein the termination material is solder.

10. The terminations of the IC package assembly of claim 8 wherein the termination material is a resilient metal.

11. The terminations of the IC package assembly of claim 8 wherein the termination material is a conductive polymer.

12. An integrated circuit package assembly comprising:
a first insulating substrate having first and second surfaces and a first outer edge extending from the first surface to the second surface and delimiting a first external dimension of the first insulating substrate;
a first plurality of interior contacts disposed on an interior region of the second surface, and
a first plurality of outer contacts disposed on the second surface proximate the first outer edge;
a first plurality of conductive paths disposed on the second surface of the first insulating substrate, each of the first plurality of conductive paths extending from a respective one of the first plurality of interior contacts to a respective one of the first plurality of outer contacts; and
a second insulating substrate having third and fourth surfaces, a first aperture extending from the third surface to the fourth surface, and a second outer edge extending from the third surface to the fourth surface and delimiting a second external dimension that is smaller than the first external dimension, wherein the third surface of the second insulating substrate is disposed against the second surface of the first insulating substrate and positioned such that the first plurality of interior contacts are positioned within a periphery of the first aperture, and such that the first plurality of outer contacts are not covered by the second insulating substrate, and at least a portion of each of the first conductive paths is covered by the second insulating substrate.

13. The integrated circuit package assembly of claim 12 further comprising a second plurality of conductive paths disposed on the fourth surface and extending from a second plurality of interior contacts proximate the first aperture to a second plurality of outer contacts proximate the second outer edge.

14. The integrated circuit package assembly of claim 13 further comprising a third insulating substrate having fifth and sixth surfaces extending to a third outer edge delimiting a third external dimension smaller than the second external dimension, the fifth surface being disposed against the fourth surface and positioned such that the third insulating substrate does not cover the second plurality of outer contacts, the third insulating substrate further comprising a second aperture having a surface area greater than a surface area of the first aperture and positioned such that the third insulating substrate does not cover the second plurality of interior contacts.

15. The integrated circuit package assembly of claim 12 wherein the first insulating substrate comprises an aperture within the center region.

16. The integrated circuit package assembly of claim 12 further comprising an insulating base wherein the first insulating substrate is disposed between the insulating base and the second insulating substrate.

17. The integrated circuit package assembly of claim 16 further comprising a conductive contact area disposed on the insulating base to receive an integrated circuit die, the conductive contact area being exposed through the aperture of the first insulating substrate and the aperture of the second insulating substrate.

18. The integrated circuit package assembly of claim 17 further comprising an integrated circuit die disposed on the conductive contact area of the insulating base.

19. The integrated circuit package assembly of claim 18 wherein the integrated circuit die comprises a first plurality of input/output (I/O) terminals that are coupled to the first plurality of conductive paths.

20. The integrated circuit package assembly of claim 19 wherein the first plurality of I/O terminals are coupled to the first plurality of conductive paths by wire-bonds that extend from the first plurality of I/O terminals to the center region of the first insulating substrate.

21. The integrated circuit package assembly of claim 19 further comprising a second plurality of conductive paths disposed on a surface of the second insulating substrate, the second plurality of conductive paths extending from a second plurality of interior contacts on a first inner peripheral region proximate the first aperture to a second plurality of outer contacts on a second outer peripheral region proximate the second outer edge of the second insulating substrate, and wherein the integrated circuit die comprises a second plurality of I/O terminals coupled to the second plurality of conductive paths.

22. The integrated circuit package assembly of claim 16 further comprising a second plurality of conductive paths disposed on a surface of the insulating base and at least partially covered by the first insulating substrate, and wherein the first insulating substrate comprises an aperture to expose one of the second plurality of conductive paths.

23. An integrated circuit (IC) package assembly comprising:
a first substrate layer having an interior region and a peripheral region;
a first plurality of signal paths that extend along a surface of the first substrate layer from signal path terminations in the interior region to signal path terminations in the peripheral region; and
a second substrate layer disposed over the surface of the first substrate layer in an orientation that forms at least a portion of a first stepped profile at an edge of the IC package assembly and that exposes the signal path terminations in the peripheral region, the second substrate further comprising a first aperture to expose the interior region of the first substrate layer, wherein none of the first plurality of signal paths are in signal continuity with a plated through hole.

24. The IC package assembly of claim 23 wherein a relationship of the first substrate layer and the second substrate layer proximate the first aperture forms at least a portion of a second stepped profile in the interior region.

25. The IC package assembly of claim 23 further comprising an integrated circuit die disposed within the aperture of the second substrate layer.

26. The IC package assembly of claim 25 further comprising conductive elements coupled between the integrated circuit die and the signal path terminations in the interior region.

27. The IC package assembly of claim 23 further comprising a second plurality of signal paths that extend along a surface of the second substrate layer from signal path terminations in an interior region of the second substrate layer proximate the first aperture to signal path terminations in a peripheral region of the second substrate layer.

28. The IC package assembly of claim 27 further comprising a third substrate layer disposed over the surface of the second substrate layer in an orientation that forms a stepped profile with respect to the second substrate layer and that exposes the signal path terminations in the peripheral region of the second substrate layer.

29. The IC package assembly of claim 23 further comprising a plurality of additional substrate layers, each additional substrate layer comprising an aperture and a plurality of a signal paths that extend along a surface of the additional substrate layer from a signal path termination in an interior region of the additional substrate layer proximate the aperture to a signal path termination in a peripheral region of the additional substrate layer, each additional substrate layer being disposed over the substrate layer immediately below in an orientation that further forms at least a portion of the first stepped profile at an edge of the IC package assembly and a portion of a second stepped profile at an interior region of the IC package assembly a stepped profile with respect to the substrate layer immediately below and that exposes the peripheral region of the substrate layer immediately below.

\* \* \* \* \*